(12) United States Patent
Sato (10) Patent No.: US 11,460,768 B2
(45) Date of Patent: Oct. 4, 2022

(54) PATTERN FORMATION METHOD, LITHOGRAPHY APPARATUS, LITHOGRAPHY SYSTEM, AND ARTICLE MANUFACTURING METHOD

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 320 days.

(21) Appl. No.: 16/898,739

(22) Filed: Jun. 11, 2020

(65) Prior Publication Data

US 2020/0301271 A1    Sep. 24, 2020

Related U.S. Application Data

(63) Continuation of application No. 14/319,540, filed on Jun. 30, 2014, now abandoned.

(30) Foreign Application Priority Data

Jul. 2, 2013 (JP) ............................. JP2013-139260
May 29, 2014 (JP) ............................. JP2014-111668

(51) Int. Cl.
*G03F 7/20* (2006.01)
*H01L 21/027* (2006.01)
(Continued)

(52) U.S. Cl.
CPC .......... *G03F 7/0002* (2013.01); *G03F 7/0035* (2013.01); *G03F 7/70633* (2013.01);
(Continued)

(58) Field of Classification Search
CPC .. G03F 7/0002; G03F 7/0035; G03F 7/70633; G03F 9/7007; G03F 9/7042; B05D 3/06; B05D 3/12; H01L 21/0274
See application file for complete search history.

(56) References Cited

U.S. PATENT DOCUMENTS 5,981,117 A    11/1999 Magome
6,503,671 B1   1/2003 Nakajima
(Continued)

FOREIGN PATENT DOCUMENTS

CN    1444268 A    9/2003
JP    S62149127 A   7/1987
(Continued)

OTHER PUBLICATIONS

Office Action issued in Japanese Appln. No. 2014-111668 dated Sep. 14, 2015. English translation provided.
(Continued)

*Primary Examiner* — Deoram Persaud
(74) *Attorney, Agent, or Firm* — Rossi, Kimms & McDowell LLP (57) ABSTRACT

A pattern forming method includes: a first step of forming a first pattern to define a first shot arrangement; and a second step of performing an imprint process, thereby forming a second pattern on the imprint material on the first pattern and defining a second shot arrangement. In the second step, the second shot arrangement is defined so as to reduce an overlay error between the first and second shot arrangements by deforming the mold. In the first step, based on information of the estimated second shot arrangement definable on the substrate when the second step is performed after the second pattern formed on the mold is amended by deforming
(Continued)

the mold, the first pattern is formed to make an overlay error between the first and second shot arrangements fall within an allowable range.

25 Claims, 7 Drawing Sheets

(51) Int. Cl.
  *G03F 7/00* (2006.01)
  *G03F 9/00* (2006.01)
  *B05D 3/06* (2006.01)
  *B05D 3/12* (2006.01)

(52) U.S. Cl.
  CPC .......... *G03F 9/7007* (2013.01); *G03F 9/7042* (2013.01); *H01L 21/0274* (2013.01); *B05D 3/06* (2013.01); *B05D 3/12* (2013.01)

(56) References Cited

U.S. PATENT DOCUMENTS

| | | | |
|---|---|---|---|
| 6,537,835 | B2 | 3/2003 | Adachi |
| 7,446,853 | B2 | 11/2008 | Fukuhara |
| 7,690,912 | B2 | 4/2010 | Tokita |
| 8,178,366 | B2 | 5/2012 | Miyoshi |
| 8,330,936 | B2 | 12/2012 | Streefkerk |
| 9,915,868 | B2 * | 3/2018 | Sato ................. B82Y 10/00 |
| 10,495,982 | B2 | 12/2019 | Chang |
| 2002/0098426 | A1 | 7/2002 | Sreenivasan |
| 2004/0138842 | A1 | 7/2004 | Leroux |
| 2005/0177811 | A1 | 8/2005 | Kotani |
| 2006/0019183 | A1 * | 1/2006 | Voisin ................. G03F 7/7035 264/293 |
| 2006/0192320 | A1 | 8/2006 | Tokita |
| 2006/0237881 | A1 | 10/2006 | Guo |
| 2010/0076590 | A1 | 3/2010 | Taylor |
| 2010/0193994 | A1 | 8/2010 | Wuister |
| 2011/0033672 | A1 | 2/2011 | Yang |
| 2011/0074064 | A1 | 3/2011 | Hayashi |
| 2011/0141489 | A1 | 6/2011 | Sato |
| 2011/0147970 | A1 | 6/2011 | Sato |
| 2011/0300646 | A1 | 12/2011 | Miyoshi |
| 2012/0244461 | A1 | 9/2012 | Nagai |
| 2013/0056903 | A1 | 3/2013 | Hayashi |
| 2013/0093113 | A1 | 4/2013 | Hayashi |
| 2013/0229638 | A1 | 9/2013 | Chen |
| 2014/0037187 | A1 | 2/2014 | Marcuccilli |
| 2014/0246808 | A1 * | 9/2014 | Tsuji ................. G03F 7/0002 264/293 |
| 2014/0353865 | A1 * | 12/2014 | Nishikawara ......... G03F 7/0002 264/40.6 |
| 2015/0008605 | A1 * | 1/2015 | Sato ................. G03F 9/7007 425/150 |
| 2015/0116678 | A1 | 4/2015 | Chang |
| 2016/0062252 | A1 | 3/2016 | Veeraraghavan |
| 2016/0161856 | A1 | 6/2016 | Johnson |
| 2017/0017162 | A1 | 1/2017 | Chang |
| 2017/0043511 | A1 * | 2/2017 | Sato ................. B29C 43/58 |
| 2017/0285495 | A1 * | 10/2017 | Sakamoto ............ G03F 7/0002 |
| 2017/0351182 | A1 * | 12/2017 | Mizumoto ............ G03F 7/7045 |
| 2020/0026202 | A1 * | 1/2020 | Takakura ............ G03F 7/70633 |
| 2021/0263427 | A1 * | 8/2021 | Li ................. G03F 7/70258 |
| 2022/0063177 | A1 * | 3/2022 | Sato ................. G03F 7/0002 |

FOREIGN PATENT DOCUMENTS

| | | | |
|---|---|---|---|
| JP | H06310399 | A | 11/1994 |
| JP | H07057991 | A | 3/1995 |
| JP | H08064516 | A | 3/1996 |
| JP | H08306610 | A | 11/1996 |
| JP | H10125589 | A | 5/1998 |
| JP | H10270317 | A | 10/1998 |
| JP | H11145040 | A | 5/1999 |
| JP | 2001110700 | A | 4/2001 |
| JP | 2002099097 | A | 4/2002 |
| JP | 2002134396 | A | 5/2002 |
| JP | 2002246291 | A | 8/2002 |
| JP | 2005303043 | A | 10/2005 |
| JP | 2006114765 | A | 4/2006 |
| JP | 2006245072 | A | 9/2006 |
| JP | 2008504141 | A | 2/2008 |
| JP | 2009212471 | A | 9/2009 |
| JP | 2009295919 | A | 12/2009 |
| JP | 2010040551 | A | 2/2010 |
| JP | 2010098310 | A | 4/2010 |
| JP | 2010283207 | A | 12/2010 |
| JP | 2011018915 | A | 1/2011 |
| JP | 2011146689 | A | 7/2011 |
| JP | 2011258605 | A | 12/2011 |
| JP | 2012160617 | A | 8/2012 |
| JP | 2012204833 | A | 10/2012 |
| JP | 2012256680 | A | 12/2012 |
| JP | 2013008815 | A | 1/2013 |
| JP | 2013055157 | A | 3/2013 |
| JP | 2013098291 | A | 5/2013 |
| JP | 2013102132 | A | 5/2013 |
| JP | 2013110162 | A | 6/2013 |
| TW | 201111159 | A1 | 4/2011 |
| TW | 201128302 | A | 8/2011 |
| WO | 9936949 | A1 | 7/1999 |
| WO | 2005121892 | A2 | 12/2005 |

OTHER PUBLICATIONS

Office Action issued in Taiwanese Appln. No. 103120345 dated Nov. 20, 2015. English translation provided.

Office Action issued in Japanese Application No. 2014-111668 dated Dec. 14, 2015.

Office Action issued in U.S. Appl. No. 14/319,540 dated Apr. 28, 2017.

Office Action issued in U.S. Appl. No. 14/319,540 dated Sep. 15, 2017.

Gilles. "Deformation of nanostructures on polymer molds during soft UV nanoimprint lithography." Nanotechnology 2010: 1-8. vol. 21, No. 24. 245307.

Office Action issued in Chinese Appln. No. 201410310980.5 dated Sep. 5, 2017. English translation provided.

Office Action issued in U.S. Appl. No. 14/319,540 dated Jan. 18, 2018.

Zheng. "Predicting overlay errors on device wafers due to the interaction of optical and EUV lithography fabrication processes." (Order No. 3222957). Available from ProQuest Dissertations & Theses Global. (304975671). Retrieved from https://search.proquest.com/docview/304975671?accountid=14753 (Year: 2006).

Office Action issued in Japanese Appln. No. 2016-050295 dated Feb. 23, 2018.

Office Action issued in U.S. Appl. No. 14/319,540 dated Jun. 14, 2018.

Office Action issued in Chinese Appln. No. 201410310980.5 dated May 25, 2018. English translation provided.

Office Action issued in U.S. Appl. No. 14/319,540 dated Mar. 8, 2019.

Office Action issued in U.S. Appl. No. 14/319,540 dated Sep. 19, 2019.

Harriott—https://apps.dtic.mil/dtic/tr/fulltext/u2/a429949.pdf (Year: 2004).

Sirotkin. "Viscous flow simulation in nanoimprint using coarse-grain method." Microelectronic Engineering, 2006: 380-883. vol. 83.

Yoo. "Unconventional Patterning with A Modulus-Tunable Mold: From Imprinting to Microcontact Printing." Chemistry of Materials. 2004: 5000-5005. vol. 16, No. 24.

Office Action issued in U.S. Appl. No. 14/319,540 dated Apr. 15, 2020.

(56) References Cited

OTHER PUBLICATIONS

Office Action issued in Japanese Application No. 2019-109004 dated Apr. 10, 2020.

* cited by examiner

FIG. 4A POSITION DEVIATION

FIG. 4B MAGNIFICATION

FIG. 4C TRAPEZOIDAL DEVIATION

FIG. 4D TWIST

FIG. 4E ROTATION

PATTERN FORMATION METHOD, LITHOGRAPHY APPARATUS, LITHOGRAPHY SYSTEM, AND ARTICLE MANUFACTURING METHOD

BACKGROUND OF THE INVENTION

Field of the Invention

The present invention relates to a pattern formation method, a lithography apparatus, a lithography system, and an article manufacturing method.

Description of the Related Art

An imprint technique is a technique capable of transferring a nanoscale micropattern, and is coming into practical use as one lithography technique for mass production of magnetic storage media and semiconductor devices. In the imprint technique, a micropattern is formed on a substrate such as a silicon substrate or glass plate by using, as an original, a mold on which a micropattern is formed using an electron beam drawing apparatus or the like. This micropattern is formed as follows. A resin is applied onto a substrate. While the mold pattern is pressed against the substrate via the resin, the substrate is irradiated with ultraviolet rays, thereby curing the resin. Then, the mold is released from the cured resin. Such an imprint technique is disclosed in, for example, Japanese Patent Laid-Open No. 2010-098310.

To get the performance of a completed device, a mold pattern needs to be transferred to a predetermined position of a pattern on a substrate at high accuracy. At this time, a pattern shape formed on the mold is generally adjusted to a pattern shape on the substrate. For example, Japanese Patent Laid-Open No. 2008-504141 has proposed an imprint apparatus including a correction mechanism of correcting the pattern shape of a mold by pressing or pulling the mold from the periphery.

International Publication No. 99/36949 has proposed a method of correcting aberrations generated in each projection optical system between exposure apparatuses of different transfer methods. The method disclosed in International Publication No. 99/36949 adjusts the projection optical system to a shape easily correctable by the projection optical system of each exposure apparatus, and adjusts and corrects the shape.

However, it is difficult for the imprint apparatus to greatly correct the pattern shape of a mold by the mold correction mechanism. Correction methods executable by the imprint apparatus are limited. In addition, the mold may be deformed in a series of imprint steps such as contact of the resin and mold, filling of the resin, light irradiation, curing of the resin, and release. Especially when the imprint process is performed at once in a plurality of shot regions or shot regions on the entire surface of a substrate, correction is difficult for the methods disclosed in Japanese Patent Laid-Open No. 2008-504141 and International Publication No. 99/36949 because the shapes of patterns formed in respective shot regions are different. As a result, the overlay accuracy may drop.

SUMMARY OF THE INVENTION

The present invention provides a pattern formation method including an imprint process for improving the accuracy of overlay with an underlayer.

The present invention in its first aspect provide a method of forming a pattern on a substrate, the method comprising: a first step of forming a first pattern in each shot region on the substrate to define a first shot arrangement; and a second step of performing, in every at least one shot region in the first shot arrangement defined in the first step, an imprint process of curing an imprint material while bringing the imprint material on the substrate and a mold into contact with each other, thereby forming a second pattern on the imprint material on the first pattern and defining a second shot arrangement, wherein in the second step, the second shot arrangement is defined so as to reduce an overlay error between the first shot arrangement and the second shot arrangement by deforming the mold, and wherein in the first step, based on information of the estimated second shot arrangement definable on the substrate when the second step is performed after the second pattern formed on the mold is amended by deforming the mold, the first pattern is formed to make an overlay error between the first shot arrangement and the second shot arrangement fall within an allowable range.

The present invention in its second aspect provide a lithography apparatus of forming a first pattern in each shot region on a substrate, comprising: an obtaining unit configured to perform, in every at least one shot region on the first pattern, an imprint process of curing an imprint material while bringing the imprint material on the substrate and a mold into contact with each other, thereby forming a second pattern, and obtaining information of an estimated second shot arrangement formable by performing an imprint process of forming the second pattern; and a controller configured to, based on the information of the second shot arrangement obtained by the obtaining unit, form the first pattern, define a first shot arrangement, and form the first pattern to become the defined shot arrangement, wherein the information of the second shot arrangement is information of an estimated shot arrangement definable on the substrate by performing an imprint process of forming a second pattern after a second pattern formed on the mold is amended by deforming the mold.

The present invention in its third aspect provide a lithography system of forming a pattern on a substrate, comprising: a lithography apparatus configured to form a first pattern in each shot region on the substrate and define a first shot arrangement; and an imprint apparatus configured to perform, in every at least one shot region in the defined first shot arrangement, an imprint process of curing a resin while bringing a mold into contact with the resin, thereby forming a second pattern on the resin on the first pattern and defining a second shot arrangement, wherein based on information of the estimated second shot arrangement definable on the substrate when the imprint process is performed, the lithography apparatus forms the first pattern to make an overlay error between the first shot arrangement and the second shot arrangement fall within an allowable range, and wherein the information of the second shot arrangement is information of an estimated shot arrangement definable on the substrate by performing an imprint process of forming a second pattern after a second pattern.

The present invention in its fourth aspect provide a method of manufacturing an article, the method comprising: forming a pattern on a substrate by using a lithography system; and processing the substrate, on which the pattern has been formed, to manufacture the article, the lithography system including: a lithography apparatus configured to form a first pattern in each shot region on the substrate and define a first shot arrangement; and an imprint apparatus configured to perform, in every at least one shot region in the defined first shot arrangement, an imprint process of curing a resin while bringing a mold into contact with the resin, thereby forming a second pattern on the resin on the first pattern and defining a second shot arrangement, wherein based on information of the estimated second shot arrangement definable on the substrate when the imprint process is performed, the lithography apparatus forms the first pattern to make an overlay error between the first shot arrangement and the second shot arrangement fall within an allowable range, and wherein the information of the second shot arrangement is information of an estimated shot arrangement definable on the substrate by performing an imprint process of forming a second pattern after a second pattern formed on the mold is amended by deforming the mold.

Further features of the present invention will become apparent from the following description of exemplary embodiments with reference to the attached drawings.

DESCRIPTION OF THE EMBODIMENTS

Figure 1:
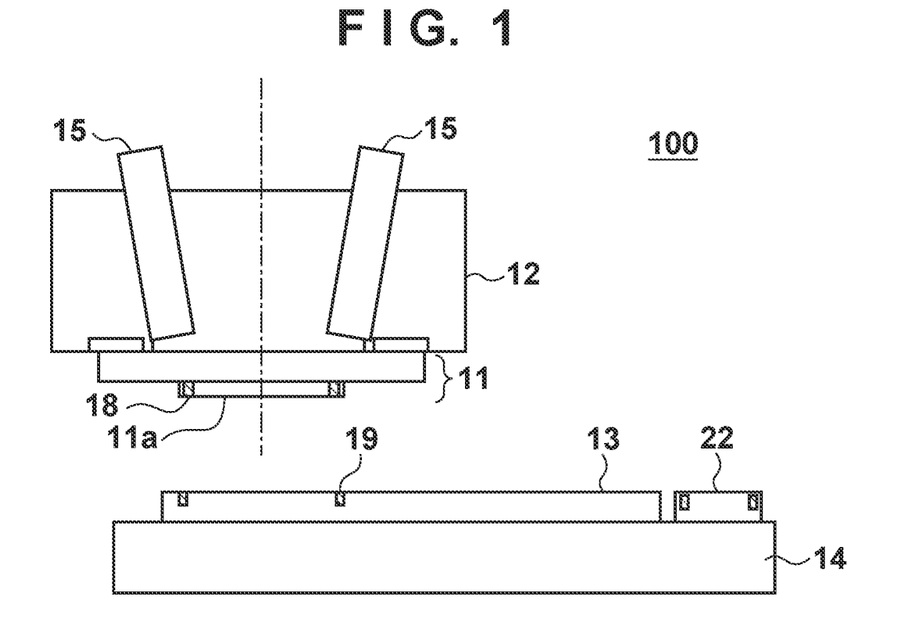
FIG. 1 is a view showing an imprint apparatus.

An embodiment of a pattern formation method according to the present invention will now be described in detail with reference to the accompanying drawings. In the respective drawings, the same reference numerals denote the same parts, and a repetitive description thereof will be omitted. FIG. 1 is a view showing the arrangement of an imprint apparatus 100 used in the embodiment. The imprint apparatus 100 forms a pattern on a resin on a substrate by performing an imprint process of curing a resin (imprint material) while bringing a mold into contact with the resin. As a resin curing method, the embodiment adopts a photo-curing method of curing a resin by irradiation of ultraviolet rays.

The imprint apparatus 100 includes a mold holding unit 12 which holds a mold 11, a substrate holding unit 14 which holds a substrate (wafer) 13, a detector (alignment scope) 15, a correction mechanism 16 which corrects the shape of the mold 11, and a controller. The imprint apparatus 100 also includes a resin supply unit (dispenser) for supplying an ultraviolet curing resin onto a substrate, a bridge plate for holding the mold holding unit 12, and a base plate for holding the substrate holding unit 14.

The mold 11 has a pattern surface 11a on which a pattern to be transferred to a resin on a substrate is formed into a three-dimensional shape. The mold 11 is made of a material, such as quartz, capable of transmitting ultraviolet rays for curing a resin on a substrate. Mold-side marks 18 are formed on the pattern surface 11a of the mold 11. The mold holding unit 12 is a holding mechanism which holds the mold 11. The mold holding unit 12 includes a mold chuck which vacuum-chucks or electrostatically chucks the mold 11, a mold stage on which the mold chuck is placed, and a driving system which drives the mold stage. The driving system of the mold stage drives the mold stage and thus the mold 11 in at least the Z-axis direction (imprint direction of the mold 11 with respect to the resin). The driving system of the mold stage may have a function of driving the mold stage not only in the Z-axis direction, but also in the X-axis direction, Y-axis direction, and θ (rotation about the Z-axis) direction.

The substrate (wafer) 13 is a substrate to which the pattern of the mold 11 is transferred. The substrate 13 includes, for example, a single-crystal silicon substrate and SOI (Silicon On Insulator) substrate. A resin is supplied (applied) to the substrate 13. Substrate-side marks 19 are formed in respective shot regions on the substrate. The substrate holding unit 14 is a holding mechanism which holds the substrate 13. The substrate holding unit 14 includes a substrate chuck which vacuum-chucks or electrostatically chucks the substrate 13, a substrate stage on which the substrate chuck is placed, and a driving system which drives the substrate stage. The driving system of the substrate stage drives the substrate stage and thus the substrate 13 in at least the X-axis direction and Y-axis direction (directions perpendicular to the imprint direction of the mold 11). The driving system of the substrate stage may have a function of driving the substrate stage not only in the X-axis direction and Y-axis direction, but also in the Z-axis direction and θ (rotation about the Z-axis) direction.

The detector 15 is constructed by a scope which optically detects (observes) the mold-side marks 18 formed on the mold 11, and the substrate-side marks 19 formed in respective shot regions on the substrate 13. The detector 15 suffices to detect the relative positional relationship between the mold-side mark 18 and the substrate-side mark 19. Hence, the detector 15 may be constructed by a scope including an optical system for simultaneously capturing the two, mold-side mark 18 and substrate-side mark 19, or a scope which detects a signal reflecting a relative positional relationship, such as an interference signal of the two marks or moiré. The detector 15 may not simultaneously detect the mold-side mark 18 and substrate-side mark 19. For example, the detector 15 may detect the relative positional relationship between the mold-side mark 18 and the substrate-side mark 19 by obtaining the respective positions of the mold-side mark 18 and substrate-side mark 19 with respect to a reference position arranged inside.

Figure 2:
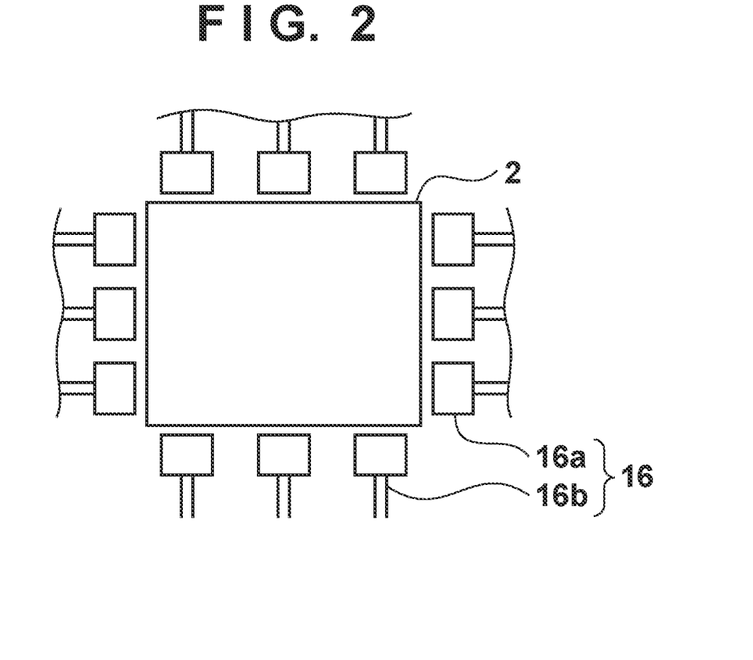
FIG. 2 is a view showing the correction mechanism of the mold of the imprint apparatus.

The correction mechanism 16 deforms the shape of the pattern surface 11a by applying force to the mold 11 in a direction parallel to the pattern surface 11a. For example, as shown in FIG. 2, the correction mechanism 16 includes suction units 16a which suck the side surfaces of the pattern surface 11a, and actuators 16b which drive the suction units 16a in directions toward and apart from the side surfaces of the pattern surface 11a. Note that the correction mechanism 16 may deform the pattern surface 11a by applying heat to the mold 11 and controlling the temperature of the mold 11.

The controller includes a CPU and memory, and controls the respective units of the imprint apparatus 100. The controller controls an imprint process and processes associated with it. For example, when performing the imprint process, the controller aligns the mold 11 and substrate 13 based on the detection result of the detector 15. Also, when performing the imprint process, the controller controls the deformation amount of the pattern surface 11a of the mold 11 by the correction mechanism 16.

Figure 3A:
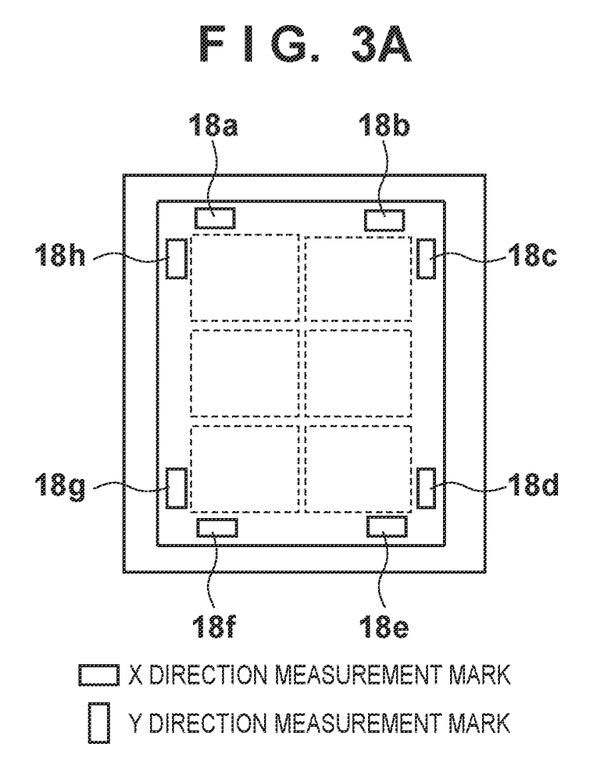
FIGS. 3A and 3B are views showing the arrangements of mold-side marks and substrate-side marks, respectively.

The mold-side mark 18 and substrate-side mark 19 used to align the mold 11 and substrate 13 will be explained with reference to FIGS. 3A and 3B. The embodiment assumes that six chip regions are arranged in one shot region on the substrate 13. FIG. 3A shows mold-side marks 18a to 18h formed at the four corners of the pattern surface 11a of the mold 11. For example, the mold-side marks 18a, 18b, 18e, and 18f having a longitudinal direction in the horizontal direction are marks having a measurement direction in the X-axis direction. The mold-side marks 18c, 18d, 18g, and 18h having a longitudinal direction in the vertical direction are marks having a measurement direction in the Y-axis direction. In FIG. 3A, regions surrounded by dotted lines are pattern regions where patterns to be transferred to six respective chip regions are formed.

Figure 3B:
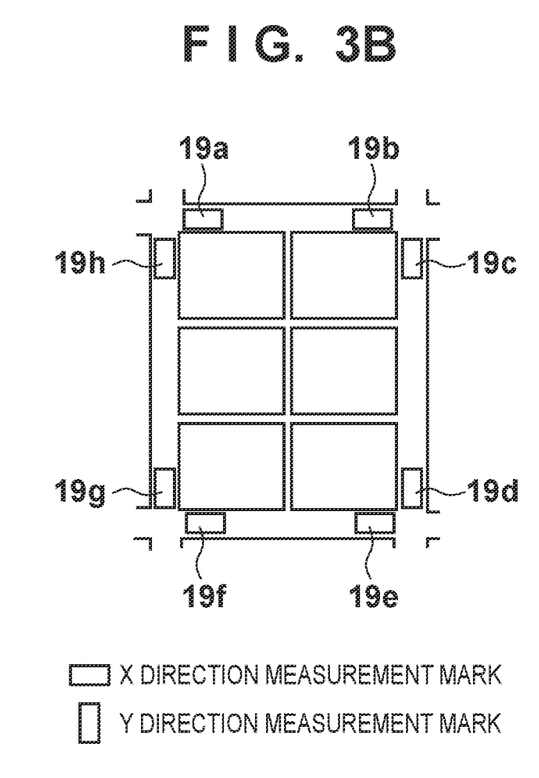

FIG. 3B shows substrate-side marks 19a to 19h formed at the four corners of one shot region on the substrate. For example, the substrate-side marks 19a, 19b, 19e, and 19f having a longitudinal direction in the horizontal direction are marks having a measurement direction in the X-axis direction. The substrate-side marks 19c, 19d, 19g, and 19h having a longitudinal direction in the vertical direction are marks having a measurement direction in the Y-axis direction. In FIG. 3B, regions surrounded by solid lines inside the shot region 13a are chip regions.

When performing the imprint process, that is, when bringing the mold 11 and the resin on the substrate 13 into contact with each other, the respective mold-side marks 18a to 18h and the respective substrate-side marks 19a to 19h are positioned close to each other. The detector 15 detects the mold-side marks 18 and substrate-side marks 19. The shape and position of the pattern surface 11a of the mold 11 can be compared with those of the shot region 13a on the substrate 13. If a large difference (deviation) is generated between the shape and position of the pattern surface 11a of the mold 11 and those of the shot region 13a on the substrate 13, the overlay error exceeds an allowable range, causing a pattern transfer error (product defect).

FIGS. 4A to 4E are views showing a deviation (second shot arrangement) generated between the shape and position of the pattern surface 11a of the mold 11 and those of the shot region 13a on the substrate 13. The deviation between the mold 11 and the shot region 13a contains a shift, magnification deviation, rotation, and the like. By detecting the position deviation amount of the mold-side mark 18 with respect to the substrate-side mark 19, it can be estimated which of the shift, magnification deviation, and rotation is the deviation.

Figure 4A:
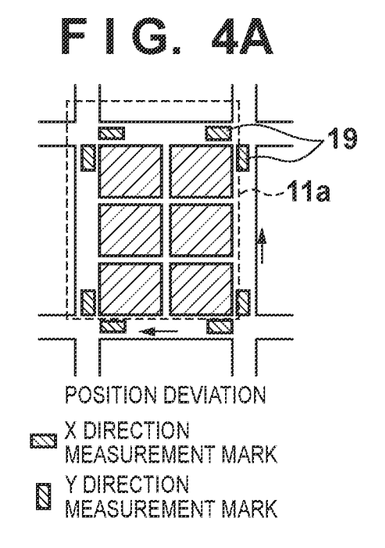
FIGS. 4A to 4E are views showing the difference in pattern shape between a mold and a substrate.
Figure 4B:
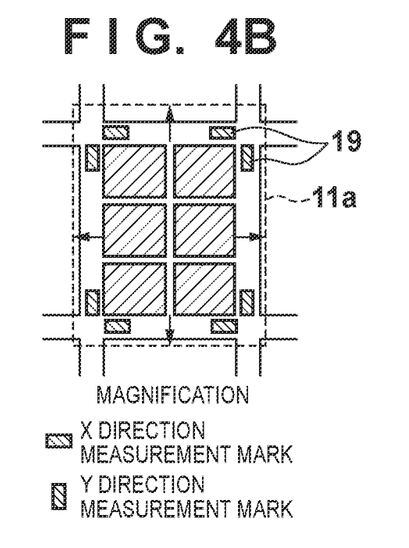
Figure 4C:
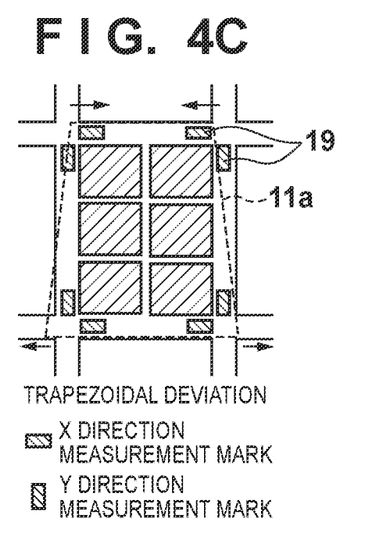

FIG. 4A shows a case in which the deviation between the mold 11 and the shot region 13a is the shift. When it is detected that the mold-side mark 18 deviates from the substrate-side mark 19 in one direction, it can be estimated that the deviation between the mold 11 and the shot region 13a is the shift. FIG. 4B shows a case in which the deviation between the mold 11 and the shot region 13a is the magnification deviation. When it is detected that the mold-side mark 18 deviates outward or inward with respect to the center of the shot region 13a, it can be estimated that the deviation is the magnification deviation. FIG. 4C shows a case in which the deviation between the mold 11 and the shot region 13a is a trapezoidal deviation. When it is detected that the mold-side mark 18 deviates outward or inward with respect to the center of the shot region 13a and the direction differs between the upper and lower sides or left and right sides of the shot region 13a, it can be estimated that the deviation is the trapezoidal deviation. Also, when it is detected that the mold-side mark 18 deviates outward or inward with respect to the center of the shot region 13a and the deviation amount differs between the upper and lower sides or left and right sides of the shot region 13a, it can be estimated that the deviation is the trapezoidal deviation.

Figure 4D:
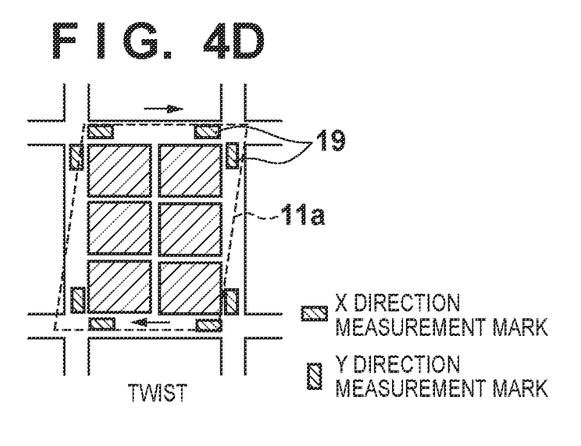
Figure 4E:
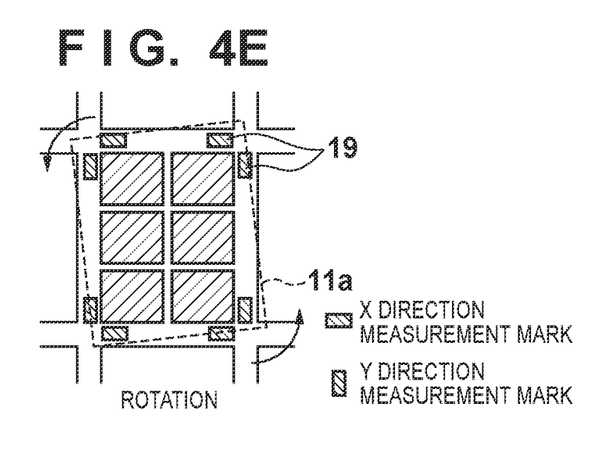

FIG. 4D shows a case in which the deviation between the mold 11 and the shot region 13a is a twist. When it is detected that the mold-side mark 18 deviates in different directions between the upper and lower sides or left and right sides of the shot region 13a, it can be estimated that the deviation is the twist. FIG. 4E shows a case in which the deviation between the mold 11 and the shot region 13a is the rotation. When the mold-side mark 18 deviates in different directions between the upper and lower sides or left and right sides of the shot region 13a in FIG. 4D, and deviates to draw a circle using a given point in the shot region as the center, it can be estimated that the deviation is the rotation.

As shown in FIGS. 4B to 4E, when the deviation between the mold 11 and the shot region 13a is the magnification deviation, trapezoidal deviation, twist, rotation, or the like, the controller controls the correction mechanism 16 to deform the shape of the pattern surface 11a of the mold 11. More specifically, the controller controls the deformation amount of the pattern surface 11a by the correction mechanism 16 so that the shape of the pattern surface 11a becomes that of the shot region 13a. The controller obtains in advance data representing the correspondence between the driving amount (that is, force to be applied to the mold 11) of the actuator 16b and the deformation amount of the pattern surface 11a, and stores the data in a memory or the like. Based on the detection result of the detector 15, the controller calculates the deformation amount of the pattern surface 11a necessary for making the shape of the pattern surface 11a coincide with that of the shot region 13a. In other words, from the position deviation amount between the mold-side mark 18 and the substrate-side mark 19 that has been detected by the detector 15, the controller calculates the degree at which the pattern surface 11a is deformed. Then, the controller obtains, from the data stored in the memory, a driving amount of the actuator 16b that corresponds to the calculated deformation amount of the pattern surface 11a, and drives the actuator 16b. The alignment and shape correction of the mold 11 and shot region 13a are performed in the above-described manner, and the mold pattern is transferred onto the substrate.

Figure 5A:
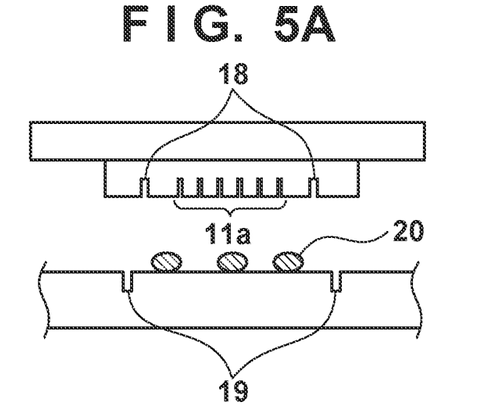
FIGS. 5A to 5C are views showing an imprint process.

A state in which the pattern of the mold 11 is transferred to a resin on a substrate by the imprint process will be explained with reference to FIGS. 5A to 5C. As shown in FIG. 5A, a resin 20 is applied to an imprint target region on the substrate till the start of imprinting. An imprint resin generally used is applied immediately before the imprint process because it is highly volatile. If the volatility is low, the resin may be applied in advance by using spin coating or the like. As described above, the controller controls the detector 15 to measure the relative positions of the mold-side mark 18 and substrate-side mark 19, and performs alignment of the two marks 18 and 19 and shape correction of the mold 11. The mold 11 has the pattern surface 11a on which an element pattern is inscribed in addition to the mold-side mark 18 for alignment.

Figure 5B:
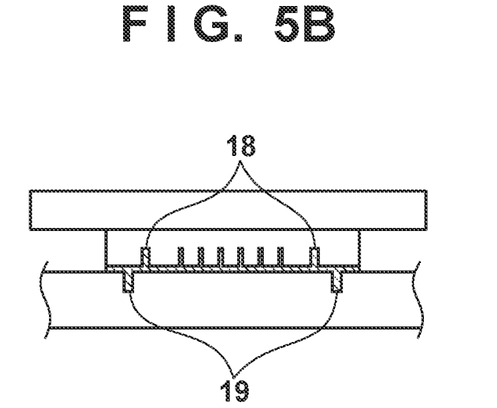

As shown in FIG. 5B, the controller brings the mold 11 into contact with the resin 20 to fill the pattern portion (three-dimensional structure) of the mold 11 with the resin 20. At this time, since the resin 20 transmits visible light, the substrate-side mark 19 can be measured. The mold 11 uses a transparent substrate made of quartz or the like in order to cure the resin 20 with ultraviolet rays. In some cases, therefore, the difference in refractive index between the mold 11 and the resin 20 is small, and the mold-side mark 18 may not be measured by only the three-dimensional structure. Thus, there have been proposed methods each of coating the mold-side mark 18 with a substance different in refractive index or transmittance from the mold 11, or changing the refractive index of the mark portion by ion irradiation or the like. By using these methods, the detector 15 can measure the mold-side mark 18 even in the state of FIG. 5B.

Figure 5C:
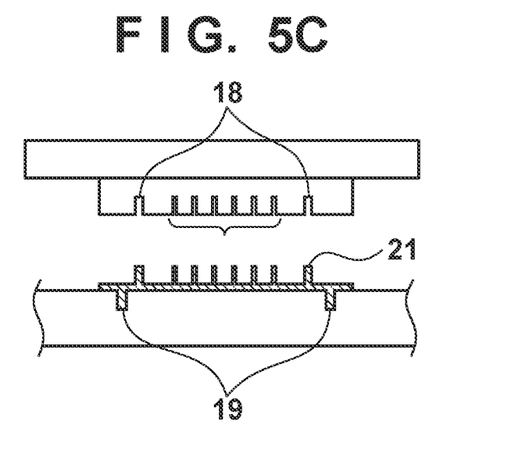

FIG. 5C shows a state in which the resin 20 is cured by irradiating it with ultraviolet rays, and then the mold 11 is released from the substrate 13. By the irradiation of ultraviolet rays, the pattern of the mold 11 is transferred to the substrate 13. At the same time, the mold-side marks 18 are also transferred to the substrate 13, forming transfer marks 21 on the substrate 13. The transfer mark 21 is a pattern transferred onto the substrate. By measuring the relative positions of the transfer mark 21 and substrate-side mark 19, overlay inspection between them can be performed.

Figure 9A:
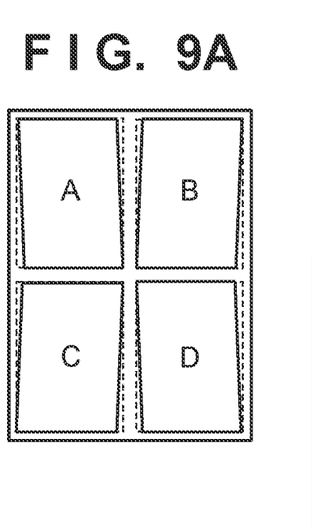
FIGS. 9A to 9C are views showing a transfer pattern information management method when simultaneously imprinting a pattern in a plurality of shot regions.
Figure 9B:
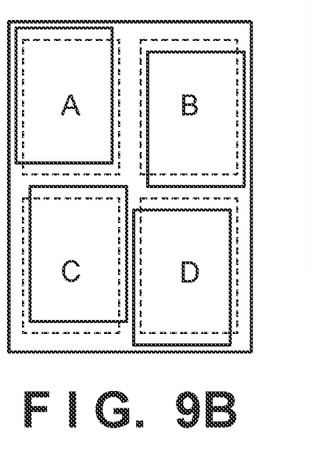
Figure 9C:
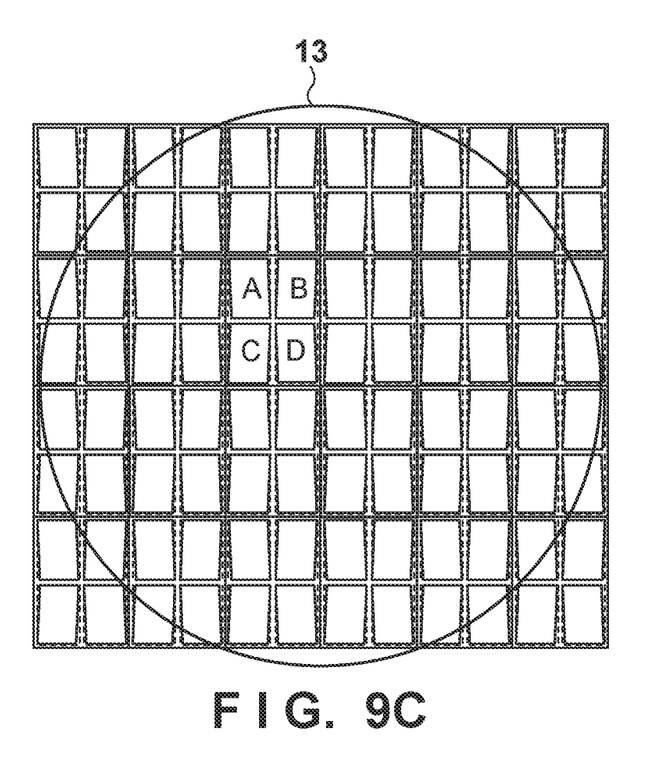

The mold 11 used in the imprint apparatus 100 needs to be drawn at a magnification equal to the line width of a predetermined mold. When the imprint process is repeated, the mold 11 contacts the resin many times, damage caused by release is accumulated, and breakage of the pattern or the like occurs. Direct drawing by an electron beam drawing apparatus or the like costs high and greatly increases the production cost. To prevent this, there has been proposed a method of fabricating a master mold and transferring it to fabricate a replica mold. In this case, a pattern distortion, twist, or the like upon transfer occurs inevitably. There have also been proposed a method of simultaneously imprinting a pattern in a plurality of shot regions to increase the productivity, and a method of transferring a pattern at once on the entire surface of a substrate. However, if the area of the pattern surface increases, deterioration of the pattern shape such as a larger pattern distortion or twist occurs. Since a large-area mold is transferred, a shape change by holding or transfer also occurs. A mold correction mechanism deforms a mold and corrects a pattern shape of the mold by applying a force to the mold consisting of a material such as quartz from the periphery as mentioned above. Therefore, even if the deviation is magnification deviation, trapezoidal deviation, twist, rotation, or the like as mentioned above, an amount of correction is limited. If a considerable great force is applied for correcting a mold, the mold itself has a potential of being damaged. It has been found that, if a mold has a greater area, it is difficult to deform a portion near the center of the mold by deforming the mold from its periphery. As explained below, it is difficult to correct a chip and a shot arrangement in a mold pattern as shown in FIGS. 9A to 9C by applying a force from the periphery of the mold. Therefore, it is impossible to correct all of them by only the correction mechanism 16 of the mold.

Hence, the present inventor proposes a method of, for example, when forming an underlying pattern (first pattern) by a projection exposure apparatus, correcting it to have a pattern shape conforming to the shape of a pattern (second pattern) formed by the imprint apparatus 100 used in a succeeding stage. A method of measuring the shape of a pattern formed on the pattern surface 11a of the mold 11 will be described below. When the shape performance of a pattern formed in the mold 11 greatly influences a pattern transferred to the substrate 13 by the imprint process, the pattern shape of the mold 11 is measured in advance at high accuracy and used as a correction amount when using the mold 11.

When a shape change caused by holding of the mold 11 by the mold holding unit 12 greatly influences the shape of the transfer pattern of the mold 11, the pattern shape of the mold 11 needs to be measured in a state in which the mold 11 is attached to the imprint apparatus 100. As shown in FIG. 1, the mold holding unit 12 holds the mold 11 used. When the mold holding unit 12 holds the mold 11, force is added to the mold 11, deforming it. Then, the shape difference from a pattern reference formed on the mold 11 is measured, measuring the pattern shape of the deformed mold 11. As the reference, a reference substrate or a reference mark 22 formed on the substrate stage is used. The reference substrate is a substrate fabricated for inspection, and its constitutive pattern is measured and managed in advance at high accuracy by a measurement apparatus outside the imprint apparatus. The reference mark 22 constitutes a pattern by using an electron beam drawing apparatus or the like, and this pattern is also managed at high accuracy.

The pattern shape of the mold 11 can be measured by measuring the relative positional relationship between the above-mentioned reference and the mark formed on the mold 11 by using the method shown in FIGS. 4A to 4E. In FIGS. 4A to 4E, eight marks formed on the mold 11 are measured. However, when the pattern region is wide or measurement needs to be executed at higher accuracy, the pattern shape can be measured at a larger number of points.

When a shape change of the mold 11 in performing the imprint process while holding the mold 11 in the apparatus greatly influences the shape of the transfer pattern, the result of actually performing the imprint process by the imprint apparatus needs to be reflected.

Figure 6:
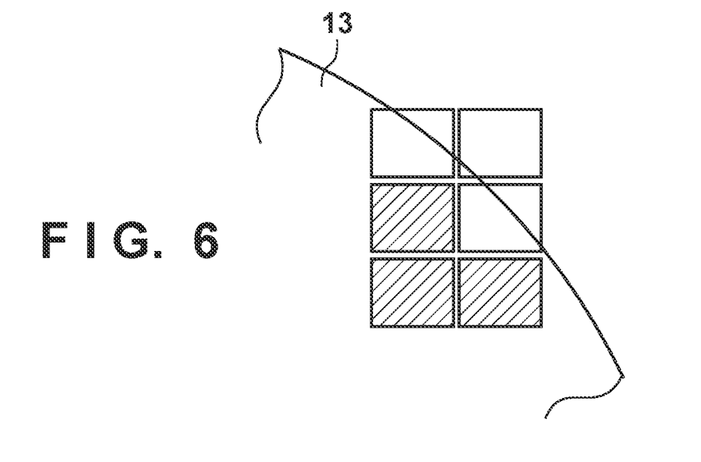
FIG. 6 is a view showing the relationship between the transfer region of the mold and the substrate end.

As shown in FIGS. 5A to 5C, when the pattern of the mold 11 is transferred, the mold-side mark 18 and pattern are transferred onto the substrate. By measuring the shape of this transferred pattern, the shape of the transfer pattern upon a shape change of the mold 11 in the imprint process can be obtained. Further, the behavior in transfer may change depending on the location on the substrate surface. For example, the holding state of the substrate 13 or the like differs between imprinting near the center of the substrate 13 and imprinting at the periphery of the substrate 13, so the shape of the transfer pattern may change. Particularly in a case in which the pattern surface 11a of the mold 11 lies on the edge of the substrate 13, as shown in FIG. 6, the behavior is highly likely to differ from that in other cases. FIG. 6 shows a state in which six chips are transferred as one shot region, but only three of them can be transferred onto the substrate 13. However, if even one chip can be transferred, the imprint process should be performed in terms of the productivity. In this case, the behavior in the transfer step is highly likely to be changed in comparison with the imprint process on the entire surface of the shot region. Therefore, when the transfer pattern shape changes at a transfer portion including the edge of the substrate 13, as shown in FIG. 6, or on the substrate surface, the shape of the transfer pattern of the mold 11 needs to be obtained for each case. For example, a pattern transferred on the substrate by the method shown in FIGS. 5A to 5C is extracted from the apparatus to measure the shape of the pattern by a measurement apparatus. By these methods, the shape of the transferred pattern can also be obtained at high accuracy, and a more accurate shape can be obtained.

By transferring the pattern of the mold 11 to a reference substrate as described above, the relative positions of the transferred pattern (mark) and an underlying pattern formed on the reference substrate are measured, and the shape of the transfer pattern can be obtained. In this case, for example, the detector 15 arranged in the imprint apparatus can also be used. The shape can be measured from the relative positions of these patterns by using the method shown in FIGS. 4A to 4E. This method does not require the measurement apparatus outside the imprint apparatus, can efficiently measure the shape, and obviates the need to separately prepare the measurement apparatus. The reference substrate having a pattern measured and managed in advance at high accuracy by the measurement apparatus or the like outside the apparatus has been exemplified as the reference for measuring a pattern shape at high accuracy. However, a substrate to be actually used may be used. An example is a so-called pilot wafer used to set imprint conditions before the start of the imprint process.

In an actual production step, the difference between an underlying pattern and a transfer pattern in the imprint apparatus is fed back to a fabrication step of forming an underlying pattern by using a projection exposure apparatus. As the production proceeds, the overlay accuracy can be further improved. In the embodiment, a correction mechanism in the imprint apparatus such as the correction mechanism 16 does not correct the pattern of the mold 11. However, the correction mechanism in the imprint apparatus may correct the pattern of the mold 11. For example, the correction mechanism 16 may obtain the shape of a transfer pattern in a state in which the correction mechanism 16 does not perform correction. In this case, a difference obtained by subtracting the amount of correction by the correction mechanism 16 from the difference between the obtained transfer pattern shape and the underlying pattern is set as the amount of correction by the projection exposure apparatus. This will enable correct a manufacturing error, which may occur in the underlayer, by the correction mechanism of the imprint apparatus, and therefore, adjustment of a shot shape will be much improved. Reversely, the item and amount of correction, which can be performed as much as possible by the correction mechanism 16 may be obtained in the above-described way, and the difference between the obtained transfer pattern and the underlying pattern may be set as the amount of correction by the projection exposure apparatus. In other words, the item and amount of correction, which can be performed by the correction mechanism 16, is performed by the imprint apparatus, and another item and amount of correction is performed by the underlayer side, and thereby the item and amount of correction is divided to that for the mold and that for the underlayer. This will enable decrease deformation amount of shot shape of the underlayer. Because a number of transferring a pattern are performed in a series of processes, an allowable amount of deformation of the shot shape naturally exists. Therefore, the method of the present invention solves a need of decreasing deformation amount of shot shape of the underlayer.

In the measurement method described here, a combination of the imprint apparatus and the mold 11, that is, whether there is a difference between apparatuses or whether the shape deformation is reproducible also needs to be taken into consideration. For example, if the deformation of the mold 11 by holding is equal between apparatuses, data of the same transfer pattern shape can be used regardless of an apparatus which performs the imprint process as long as the model is the same. In measurement, therefore, the difference between apparatuses or the reproducibility is desirably measured.

The deformation difference between apparatuses can be obtained by performing the same measurement on the same mold 11 in a plurality of imprint apparatuses. If there is a difference between the apparatuses, a combination of the imprint apparatus and the mold 11 is indispensable information, and pieces of identification data for the apparatuses need to be managed. The reproducibility can be obtained by repeating the steps from holding of the mold 11 up to measurement a plurality of times by a single imprint apparatus. If the measurement results vary, the average shape of them is obtained, and the correction mechanism 16 arranged in the imprint apparatus executes fine correction by the variation. In this way, a pattern shape to be transferred by the imprint apparatus can be obtained.

Figure 7:
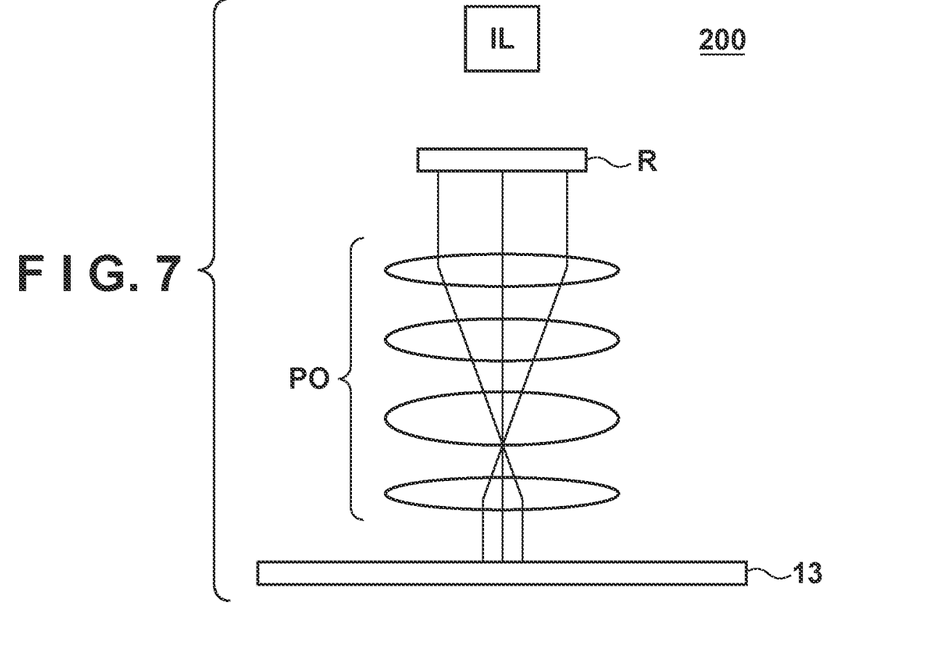
FIG. 7 is a view showing an exposure apparatus.
Figure 8A:
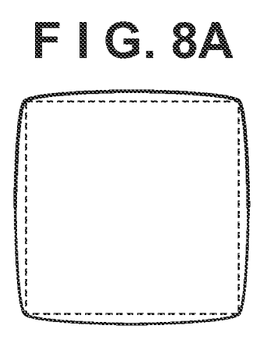
FIGS. 8A to 8E are views each showing the state of correction of a transfer shape by the exposure apparatus.

Based on a pattern shape to be transferred by the above-described imprint apparatus, a projection exposure apparatus 200 forms an underlying pattern as a stage preceding pattern formation by the imprint apparatus 100. Generation of an image distortion in the projection exposure apparatus will be explained in detail. First, generation of an image distortion in a relatively simple step & repeat reduction projection exposure apparatus (stepper) will be explained with reference to FIGS. 7 and 8A to 8E. As shown in FIG. 7, the stepper uses a bi-telecentric projection optical system PO. When a constituted lens element or a mask (reticle) R is driven in a direction parallel to the optical axis of the projection optical system PO, an image change (magnification component) of a component symmetrical about the optical axis occurs. Also, the lens element to be driven can generate, for example, a symmetrical distortion (barrel distortion) in which the image of a square pattern indicated by a dotted line in FIG. 8A is changed into a shape as indicated by a solid line. When a projection optical system in which the reticle side is non-telecentric is used as the projection optical system PO, only the magnification can be changed by driving the lens element in the optical axis direction of the projection optical system PO.

Figure 8B:
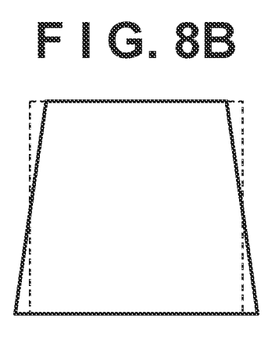

When the reticle R or lens element is tilted with respect to a plane perpendicular to the optical axis of the projection optical system PO, the square pattern can be changed into a trapezoidal shape indicated by a solid line, as shown in FIG. 8B. That is, a trapezoidal distortion can be generated by changing the magnification component using the rotation axis as the center. Not only the lens element but also another constituted optical element may be configured to be drivable. Alternatively, a lens group including a plurality of lenses may be configured to be drivable. A pattern shape obtained by moving the position or orientation of a given lens element depends on the optical arrangement. Thus, a lens element to be moved is selected, as needed.

In general, when an image distortion is generated, the image plane position (focus), coma, or the like secondarily changes along with the generated image distortion, so the reticle R and lens element need to be driven to cancel the change. This will be simply explained by exemplifying three, image plane position (focus), coma, and distortion. For example, to change only the distortion, while independently driving the reticle R and lens element in the stage of initial adjustment, the three imaging characteristics of the focus, coma, and distortion are measured, obtaining the change coefficients of the three imaging characteristics. Simultaneous linear equations with two unknowns are set up by using the change coefficients of the two imaging characteristics except for the focus, and the driving amounts of the reticle R and lens element. Then, a predetermined amount is substituted into the change coefficient of the distortion in the equations, and 0 is substituted into the change coefficient of the coma, thereby setting up new simultaneous equations. The reticle R and lens element are driven in accordance with driving amounts obtained by solving these equations. The focus is excluded because, when the lens or the like is driven to correct another imaging characteristic such as the distortion, the focus fluctuates accessorily and needs to be corrected by another detection unit. The focus can be corrected by changing the target value of a focus detection system (not shown) in consideration of the fluctuation amount of the secondarily changed focus. As described above, the static exposure stepper can relatively easily correct a component which changes in proportion to an axially symmetrical component or tilt axis.

Figure 8C:
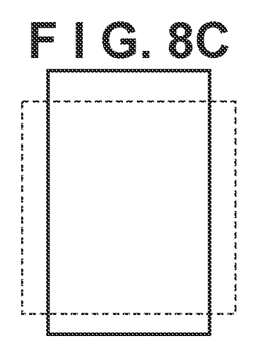
Figure 8D:
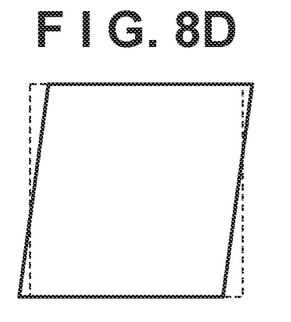
Figure 8E:
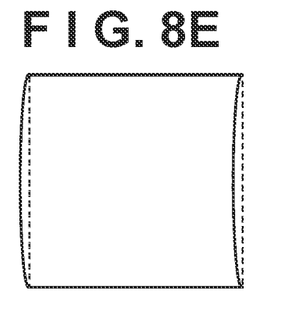

In a scanning exposure apparatus (scanner) such as a step & scan exposure apparatus, a pattern is formed after scanning exposure. Thus, only a change of the image shape of the projection optical system PO is insufficient. An image distortion in the scanning direction is averaged during scanning, and this needs to be taken into consideration. First, when the magnification is changed, the magnification of the projection optical system PO is changed by the same method as that for the stepper. In addition, the relative scanning speeds (synchronous speed ratio) of the reticle R and substrate need to be changed. The magnification in the non-scanning direction can be changed by changing the magnification of the projection optical system PO. The magnification in the scanning direction can be changed by changing the synchronous speed ratio of the reticle R and substrate. The main controller of the scanner can generate an image distortion (rectangular component) in which a square pattern indicated by a dotted line in FIG. 8C is changed into a rectangular shape indicated by a solid line. By giving an offset to the relative angles of the reticle R and substrate in the scanning direction, an image distortion (rhomboidal or parallelogram-shaped image distortion) as indicated by a solid line in FIG. 8D can be generated. By gradually changing the relative angles of the reticle R and substrate in the scanning direction during scanning, an image distortion as indicated by a solid line in FIG. 8E can be generated. A change of the magnification in the scanning direction by changing the synchronous speed ratio of the reticle and substrate, and generation of an image distortion by giving an offset to the relative angles the reticle and substrate in the scanning direction are described in detail in Japanese Patent Laid-Open Nos. 6-310399 and 7-57991.

In this fashion, the scanner can generate image distortions independently in the scanning direction and non-scanning direction in order to form the pattern image of the reticle R by relatively scanning (synchronously moving) the reticle R and substrate. By changing conditions such as the synchronous speed ratio and the relative angle in the scanning direction during scanning, an image distortion which changes depending on the scanning position can be generated.

By the above-described method, the projection exposure apparatus 200 is used to fabricate an underlayer of a shape (first shot arrangement) conforming to the shape (second shot arrangement) of the transfer pattern of the imprint apparatus 100 used in a succeeding stage. The projection exposure apparatus generally performs an exposure process for each shot region. In the imprint process, however, time is taken to fill the three-dimensional structure of a mold with a resin at the time of transfer. It is therefore efficient to simultaneously transfer the pattern to one or more shot regions, for example, a plurality of shot regions. That is, the number of shot regions to undergo transfer at once may be different between the projection exposure apparatus and the imprint apparatus. A case in which the imprint apparatus forms a pattern at once in four shot regions, as shown in FIG. 9A, will be examined. In this case, a pin-cushion shape is generated in the transfer region, so four shot regions A to D have different shapes. To correct the shape of the underlayer in a preceding projection exposure step (first step) when this imprint process step (second step) exists in a succeeding stage, the shapes of patterns in the four respective shot regions need to be grasped, managed, and transferred.

Not only the distortion and deformation of the entire imprint region, but also the relative positions of shot regions (patterns) formed in the imprint region, as shown in FIG. 9B, need to be considered.

The positions and shapes of shot regions (patterns) in the imprint region, and the like will be generically called "mark arrangements" hereinafter.

FIG. 9C shows an example in which the imprint apparatus is used to perform the imprint process for four shot regions serving as a unit. In this case, the shapes of the shot arrangements of the four shot regions A to D are different. Thus, the projection exposure apparatus needs to form an underlying pattern so that the overlay error in each of the four shot regions falls within an allowable range. At the substrate end, only some of the four shot regions may be formed. Hence, the position of a shot region to undergo imprinting and the correction amount need to be managed to transfer a pattern by the projection exposure apparatus. When imprinting a pattern at once on the entire surface of a substrate, the shape may be different between all shot regions. It is therefore necessary to manage the correction amount for each shot region, and transfer a pattern by the projection exposure apparatus.

Further, when forming an underlying pattern by using the projection exposure apparatus, it is desirable to minimize the difference between shot regions to simultaneously undergo imprinting. For example, as for the scanner, the transfer performance may change depending on the scanning direction in exposure. It is thus desirable to perform scanning exposure in the same direction in all shot regions to simultaneously undergo imprinting.

Figure 10:
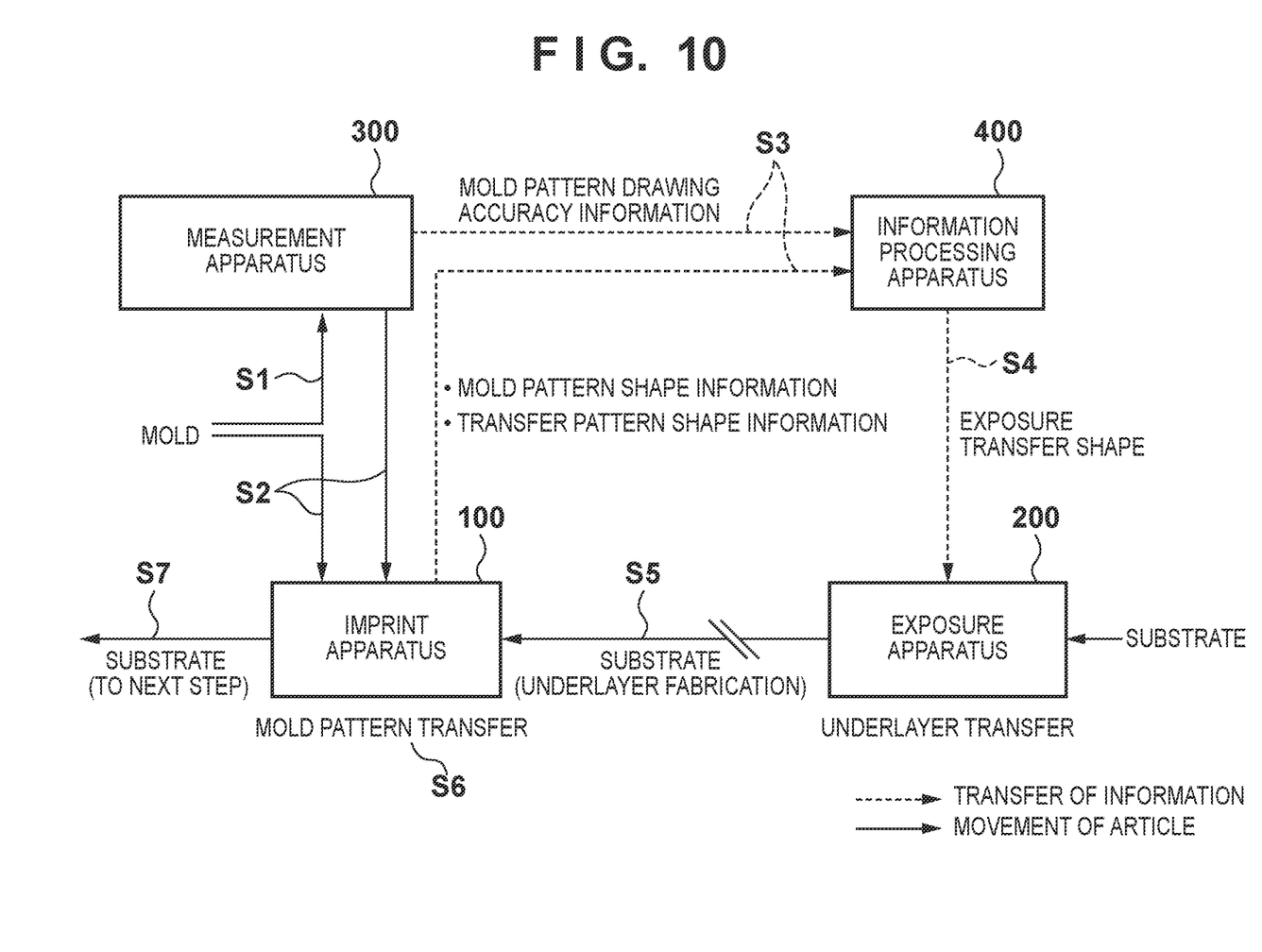
FIG. 10 is a view showing a lithography system and pattern formation method.

A lithography system which forms a pattern on a substrate according to the present invention will be described with reference to FIG. 10. The lithography system includes a measurement apparatus 300, an information processing apparatus 400, the imprint apparatus 100, and the projection exposure apparatus 200. The lithography system also includes a development apparatus which develops a resist pattern formed by the imprint apparatus 100 or projection exposure apparatus 200, and an etching apparatus. The projection exposure apparatus 200 forms an underlying pattern (first pattern) in each shot region on a substrate, and defines the first shot arrangement.

The imprint apparatus 100 performs the imprint process for every one or more shot regions in the first shot arrangement defined using the projection exposure apparatus 200, thereby forming the second pattern on the underlying pattern and defining second shot regions. The measurement apparatus 300 performs measurement to obtain an estimated second shot arrangement definable on the substrate when the imprint process is performed. The information processing apparatus (obtaining unit) 400 obtains the measurement result of the measurement apparatus 300, and holds it as information of the estimated second shot arrangement.

The operations of the measurement apparatus 300, information processing apparatus 400, imprint apparatus 100, and projection exposure apparatus 200, and exchange of pieces of information between them when the lithography system forms a pattern on a substrate will be explained below.

(Step S1) The measurement apparatus 300 measures the pattern of the pattern surface 11a in order to measure the accuracy of a pattern formed on the pattern surface 11a of the mold 11. As a result, the shape of the pattern surface 11a itself can be obtained.

(Step S2) The measurement apparatus 300 or a scope in the imprint apparatus measures the shape of the pattern in a necessary step installed in the imprint apparatus in a state in which the imprint apparatus holds the mold 11, or when the influence of a shape change of the pattern that is generated in the imprint step is large.

(Step S3) The information processing apparatus 400 stores the measurement results in steps S1 and S2. When a shape change of the pattern depends on a combination of the mold 11 and the imprint apparatus, the information processing apparatus 400 holds and manages a set of combination information and measurement result information. The information processing apparatus 400 similarly manages the deformation of the pattern in a shot region on the substrate surface or including a substrate edge.

(Step S4) Based on the held information, the information processing apparatus 400 sends, to the projection exposure apparatus 200, shape information of an underlying pattern to be formed by an exposure process. The projection exposure apparatus 200 transfers the pattern by the exposure process based on the underlying pattern shape information received from the information processing apparatus 400.

(Step S5) The substrate 13 on which the projection exposure apparatus 200 has transferred the underlying pattern undergoes steps such as development and etching, forming an underlying pattern.

(Step S6) The imprint apparatus 100 transfers the pattern to the substrate 13 by performing the imprint process on the substrate 13 bearing the underlying pattern. The information processing apparatus 400 manages a mold and imprint apparatus used to imprint a coincident pattern shape on the substrate 13 to undergo the imprint process. In accordance with an instruction from the information processing apparatus 400, the substrate 13 is sent to a mold/imprint apparatus providing the coincident shape, and the process advances to a transfer step based on imprinting.

(Step S7) The substrate 13 on which the imprint apparatus 100 has transferred the pattern is sent to the next step such as development or etching.

By performing steps S1 to S7 described above, the transfer pattern shape of the mold 11 and the underlying shape can be made to coincide with each other even when the imprint process is performed simultaneously in a plurality of shot regions. The embodiment has adopted the projection exposure apparatus as a lithography apparatus which transfers a pattern to an underlayer. However, a charged particle beam drawing apparatus or the like is also usable as the lithography apparatus which transfers a pattern to an underlayer.

In the above-mentioned embodiment, the imprint apparatus can perform shape correction using a correction mechanism. For example, a substrate manufactured by an exposure apparatus has a manufacturing error. This manufacturing error remains as an error in a shot shape when the substrate is imprinted by an imprint apparatus. This error in a shot shape can be corrected by a correction mechanism of the imprint apparatus.

Further, in another example, all of the manufacturing error can be corrected in the underlayer side. However, a number of transferring a pattern are performed in a series of processes. Thus, an allowable amount of deformation of the shot shape naturally exists. Therefore, there is a need of decreasing deformation amount of shot shape. In this case, a method, wherein correcting a part of correction is performed by the imprint apparatus, and the rest of correction is performed in the underlayer side, can be thinkable. In this case, a correction item and a correction amount in the imprint apparatus 100 can be sent to the information processing apparatus 400 in S3, or can be possessed by the information processing apparatus 400 from the beginning as information if the correction item and the correction amount is inherent in the imprint apparatus 100. Then, a shape which is obtained by deducting an item and amount of correction, which can be performed by the imprint apparatus, from a pattern shape, to be imprinted, sent in S3, is sent to the exposure apparatus 200 and the underlayer is manufactured in S4. Imprint operation with much adjusted shapes having less correction amounts will be possible by sending the underlayer manufactured in S4 to the imprint apparatus 100 and performing a shape correction using the correction mechanism of the imprint apparatus 100.

In this embodiment, the correction mechanism 16 is explained as a shape correction mechanism of the imprint apparatus. However, the shape correction mechanism of the imprint apparatus is not limited to the correction mechanism 16. A shape correction mechanism, which can correct a shape in the imprint apparatus, can be used in the present invention.

[Method of Manufacturing Article]

A method of manufacturing an article according to the embodiment of the present invention is suitable for manufacturing an article such as a microdevice (for example, a semiconductor device) or an element having a microstructure. The manufacturing method includes a step of forming a pattern on a substrate by using the lithography apparatus including the projection exposure apparatus 200 and imprint apparatus 100. Further, the manufacturing method includes other well-known steps (for example, oxidization, deposition, vapor deposition, doping, planarization, etching, resist removal, dicing, bonding, and packaging) of processing the pattern-formed substrate. The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2013-139260, filed Jul. 2, 2013 and 2014-111668, filed May 29, 2014, which are hereby incorporated by reference herein in their entirety.

What is claimed is:

1. A pattern forming method of individually forming a first pattern to each of a plurality of shot regions in a substrate by performing a scanning exposure, in a case where second patterns are to be simultaneously formed to the plurality of shot regions after the first patterns are respectively formed, by using a mold that has a plurality of pattern regions arranged to correspond to the plurality of shot regions such that one of the second patterns is arranged in each of the plurality of pattern regions, wherein the first pattern is individually formed to each of the plurality of shot regions to which the second patterns are to be simultaneously formed, by performing the scanning exposure with a same scanning direction for the plurality of shot regions.

2. A pattern forming method of individually forming a first pattern to each of a plurality of shot regions in a substrate by performing a scanning exposure, in a case where second patterns are to be simultaneously formed to the plurality of shot regions by using a mold that has a plurality of pattern regions arranged to correspond to the plurality of shot regions such that one of the second patterns is arranged in each of the plurality of pattern regions,
wherein a scanning direction of the scanning exposure for forming the first pattern is determined in accordance with regions where the second patterns are to be simultaneously formed.

3. The pattern forming method according to claim 1, wherein the first pattern is formed by using a scanning exposure apparatus which performs the scanning exposure of the substrate by scanning a pattern formed in a mask to each of the plurality of shot regions.

4. The pattern forming method according to claim 1, wherein the first pattern is formed by using a scanning exposure apparatus which performs the scanning exposure of the substrate by transferring a pattern to each of the plurality of shot regions while scanning the substrate.

5. The pattern forming method according to claim 1, wherein the first pattern is individually formed to each of the plurality of shot regions, while correcting a shape of the first pattern so that overlay errors between the first patterns and the second patterns respectively fall within an allowable range, based on information on shapes of the second patterns to be capable of being simultaneously formed to the plurality of shot regions.

6. The pattern forming method according to claim 5, wherein the information is obtained based on a result of measuring shapes of the plurality of pattern regions in the mold.

7. The pattern forming method according to claim 5, wherein the information is obtained based on a result of measuring a shape of a pattern region in a mold which is mounted on an imprint apparatus for forming the second patterns.

8. The pattern forming method according to claim 7, wherein the result is obtained by using a detector provided in an imprint apparatus for forming the second patterns.

9. The pattern forming method according to claim 5, wherein the information is obtained based on a result of measuring shapes of the second patterns which have formed on another substrate using the mold.

10. The pattern forming method according to claim 5, wherein the information is obtained based on a result of measuring overlay errors between the first shot patterns and the second patterns which have formed on another substrate.

11. The pattern forming method according to claim 1, wherein the first pattern is individually formed to each of the plurality of shot regions, while correcting a position of the first pattern so that overlay errors between the first patterns and the second patterns respectively fall within an allowable range, based on information on positions of the second patterns to be capable of being simultaneously formed to the plurality of shot regions.

12. The pattern forming method according to claim 11, wherein the information further includes identification data of the mold and an imprint apparatus for forming the second patterns.

13. A pattern forming method of forming patterns on a substrate, the method comprising:

a first step of individually forming a first pattern to each of a plurality of shot regions in the substrate by a scanning exposure; and
a second step of simultaneously forming second patterns to the plurality of shot regions in which the first patterns have been respectively formed, by using a mold that has a plurality of pattern regions arranged to correspond to the plurality of shot regions such that one of the second patterns is arranged in each of the plurality of pattern regions, after the first step,
wherein in the first step, the first pattern is individually formed to each of the plurality of shot regions to which the second patterns are to be simultaneously formed, by performing the scanning exposure with a same scanning direction for the plurality of shot regions.

14. A lithography apparatus for individually forming a first pattern to each of a plurality of shot regions in a substrate by performing a scanning exposure, in a case where second patterns are to be simultaneously formed to the plurality of shot regions after the first patterns are respectively formed, by using a mold that has a plurality of pattern regions arranged to correspond to the plurality of shot regions such that one of the second patterns is arranged in each of the plurality of pattern regions, the apparatus comprising:
a controller configured to control individually forming the first pattern to each of the plurality of shot regions to which the second patterns are to be simultaneously formed, by performing the scanning exposure with a same scanning direction for the plurality of shot regions.

15. A lithography apparatus for individually forming a first pattern to each of a plurality of shot regions in a substrate by performing a scanning exposure, in a case where second patterns are to be simultaneously formed to the plurality of shot regions after the first patterns are respectively formed, by using a mold that has a plurality of pattern regions arranged to correspond to the plurality of shot regions such that one of the second patterns is arranged in each of the plurality of pattern regions, the apparatus comprising:
a controller configured to control individually forming the first pattern to each of the plurality of shot regions by performing the scanning exposure in a scanning direction determined in accordance with regions where the second patterns are to be simultaneously formed.

16. The lithography apparatus according to claim 14, further comprising an obtaining unit configured to obtain information on shapes of the second patterns to be capable of being simultaneously formed to the plurality of shot regions,
wherein the controller is configured to control individually forming the first pattern to each of the plurality of shot regions, while correcting a shape of the first pattern so that overlay errors between the first patterns and the second patterns respectively fall within an allowable range, based on the information obtained by the obtaining unit.

17. The lithography apparatus according to claim 14, further comprising an obtaining unit configured to obtain information on positions of the second patterns to be capable of being simultaneously formed to the plurality of shot regions,
wherein the controller is configured to control individually forming the first pattern to each of the plurality of shot regions, while correcting a position of the first pattern so that overlay errors between the first patterns and the second patterns respectively fall within an allowable range, based on the information obtained by the obtaining unit.

18. A lithography system for forming patterns on a substrate, the system comprising:
   a lithography apparatus configured to individually form a first pattern to each of a plurality of shot regions in the substrate, by performing a scanning exposure with a same scanning direction for the plurality of shot regions, and
   an imprint apparatus configured to simultaneously form second patterns to the plurality of shot regions in which the first patterns have been respectively formed, by using a mold that has a plurality of pattern regions arranged to correspond to the plurality of shot regions such that one of the second patterns is arranged in each of the plurality of pattern regions.

19. A lithography system for forming patterns on a substrate, the system comprising:
   a lithography apparatus configured to individually form a first pattern to each of a plurality of shot regions in the substrate, and
   an imprint apparatus configured to simultaneously form second patterns to the plurality of shot regions in which the first patterns have been respectively formed, by using a mold that has a plurality of pattern regions arranged to correspond to the plurality of shot regions such that one of the second patterns is arranged in each of the plurality of pattern regions,
   wherein the lithography apparatus is configured to individually form the first pattern to each of the plurality of shot regions by performing a scanning exposure in a scanning direction determined in accordance with regions where the second patterns are to be simultaneously formed.

20. A method of manufacturing an article, the method comprising:
   forming pattern on a substrate using a lithography system according to claim 18,
   processing the substrate, on which the patterns have been formed, to manufacture the article.

21. A method of manufacturing an article, the method comprising:
   forming pattern on a substrate using a lithography system according to claim 19,
   processing the substrate, on which the patterns have been formed, to manufacture the article.

22. A pattern forming method of individually forming a first pattern to each of a plurality of shot regions in a substrate, in a case where second patterns are to be simultaneously formed to the plurality of shot regions after the first patterns are respectively formed, by using a mold that has a plurality of pattern regions arranged to correspond to the plurality of shot regions such that one of the second patterns is arranged in each of the plurality of pattern regions,
   wherein the first pattern is individually formed to each of the plurality of shot regions, while correcting at least one of a shape and a position of the first pattern so that overlay errors between the first patterns and the second patterns respectively fall within an allowable range, based on information on at least one of shapes and positions of the second patterns to be capable of being simultaneously formed to the plurality of shot regions by deforming the mold.

23. A lithography apparatus for individually forming a first pattern to each of a plurality of shot regions in a substrate, in a case where second patterns are to be simultaneously formed to the plurality of shot regions after the first patterns are respectively formed, by using a mold that has a plurality of pattern regions arranged to correspond to the plurality of shot regions such that one of the second patterns is arranged in each of the plurality of pattern regions, the apparatus comprising:
   an obtaining unit configured to obtain information on at least one of shapes and positions of the second patterns to be capable of being simultaneously formed to the plurality of shot regions by deforming the mold, and
   a controller configured to control individually forming the first pattern to each of the plurality of shot regions, while correcting at least one of a shape and a position of the first pattern so that overlay errors between the first patterns and the second patterns respectively fall within an allowable range, based on the information obtained by the obtaining unit.

24. A lithography system for forming patterns on a substrate, the system comprising:
   a lithography apparatus configured to individually form a first pattern to each of a plurality of shot regions in the substrate; and
   an imprint apparatus configured to simultaneously form second patterns to the plurality of shot regions in which the first patterns have been respectively formed, by using a mold that has a plurality of pattern regions arranged to correspond to the plurality of shot regions such that one of the second patterns is arranged in each of the plurality of pattern regions,
   wherein the lithography apparatus is configured to individually form the first pattern to each of the plurality of shot regions, while correcting at least one of a shape and a position of the first pattern so that overlay errors between the first patterns and the second patterns respectively fall within an allowable range, based on information on at least one of shapes and positions of the second patterns to be capable of being simultaneously formed to the plurality of shot regions by deforming the mold.

25. A method of manufacturing an article, the method comprising:
   forming pattern on a substrate using a lithography system according to claim 24,
   processing the substrate, on which the patterns have been formed, to manufacture the article.

* * * * *